United States Patent [19]
Okamura

[11] Patent Number: 6,011,308
[45] Date of Patent: Jan. 4, 2000

[54] SEMICONDUCTOR DEVICE HAVING A BARRIER FILM FORMED TO PREVENT THE ENTRY OF MOISTURE AND METHOD OF MANUFACTURING THE SAME

[75] Inventor: Ryuichi Okamura, Tokyo, Japan

[73] Assignee: NEC Corporation, Tokyo, Japan

[21] Appl. No.: 08/874,359

[22] Filed: Jun. 13, 1997

[30] Foreign Application Priority Data

Jun. 14, 1996  [JP]  Japan .................................. 8-153793

[51] Int. Cl.$^7$ .............................................. H01L 23/532
[52] U.S. Cl. .................................... 257/751; 257/640
[58] Field of Search .................................... 257/751, 774, 257/915, 650, 640, 641, 649

[56] References Cited

U.S. PATENT DOCUMENTS 4,962,414  10/1990  Liou et al. .............................. 257/915

FOREIGN PATENT DOCUMENTS

| 1-212451 | 8/1989 | Japan . |
|---|---|---|
| 2-158132 | 6/1990 | Japan . |
| 3-181135 | 8/1991 | Japan . |
| 4-14226 | 1/1992 | Japan . |
| 4-33356 | 2/1992 | Japan . |
| 4-207054 | 7/1992 | Japan . |
| 5-3166 | 1/1993 | Japan . |
| 6-53334 | 2/1994 | Japan . |
| 6-69152 | 3/1994 | Japan . |
| 6-163713 | 6/1994 | Japan . |
| 6-310610 | 11/1994 | Japan . |
| 91/11827 | 8/1991 | WIPO ................................... 257/641 |

OTHER PUBLICATIONS

"Secondary slow trapping—A new moisture induced instability phenomenon in scaled CMOS devices", 20th Ann. Proc. International Reliability Physics Symposium, pp. 113–121, 1982.

Primary Examiner—David B. Hardy

[57] ABSTRACT

A semiconductor device includes a silicon substrate, a first insulating film, a barrier film, a contact hole, a protective film, a barrier metal, and an interconnection metal. A semiconductor element is formed on the silicon substrate. The first insulating film is formed on the silicon substrate. The barrier film is formed on the first insulating film to prevent moisture from externally entering. The contact hole is formed through the barrier film and the insulating film to a depth at which the silicon substrate is exposed. The protective film is formed on the side surface of the contact hole to protect the first insulating film against etching which is performed to remove a spontaneous oxide film formed on a surface of the silicon substrate which is exposed on a bottom surface of the contact hole. The barrier metal is continuously formed on at least the side and bottom surfaces of the contact hole and serves as a buffer conductor. The interconnection metal is buried in the contact hole on which the barrier metal is formed. A semiconductor device manufacturing method is also disclosed.

9 Claims, 6 Drawing Sheets

SEMICONDUCTOR DEVICE HAVING A BARRIER FILM FORMED TO PREVENT THE ENTRY OF MOISTURE AND METHOD OF MANUFACTURING THE SAME

BACKGROUND OF THE INVENTION

The present invention relates to a semiconductor device having a barrier film formed to prevent the entry of moisture and a method of manufacturing the same and, more particularly, to a semiconductor device which prevents an overhang of a barrier film on the side wall of a contact hole after etching, and a method of manufacturing the same.

In the conventional process of manufacturing a semiconductor device such as a scaled MOS (Metal Oxide Semiconductor) transistor, secondary slow trapping occurs. Slow trapping is a phenomenon in which Vt characteristics and the like of a transistor change with time owing to the moisture contained in an interlevel insulating film. Slow trapping is described in detail in M. Noyori et al, "Secondary slow trapping—A new moisture induced instability phenomenon in scaled CMOS devices", 20th Ann. Proc. International Reliability Physics Symposium, pp. 113–121, 1982.

In a conventional semiconductor device, a film exhibiting good barrier properties with respect to moisture, e.g., a nitride film, is formed on a silicon substrate to prevent the entry of moisture so as to suppress slow trapping.

Some restrictions are imposed on an area in which this barrier film is formed. FIG. 2 shows a conventional semiconductor device having a barrier film formed on its surface after the interconnection step is complete. Referring to FIG. 2, gate polysilicon 9, an LDD side wall oxide film 9b, and a field oxide film 10 are selectively formed on a silicon substrate 1. A first interconnection 32, a second interconnection 42, a third interconnection 52, and a fourth interconnection 62 are sequentially formed on the silicon substrate 1, on which the gate polysilicon 9 and the like have been formed, through interlevel insulating films 33, 43, and 53. The first to fourth interconnections 32, 42, 52, and 62 are connected to each other through a contact hole 21, a first through hole 31, a second through hole 41, and a third through hole 51. A cover film 63 is formed on the fourth interconnection 62 and the interlevel insulating film 53 and a nitride film 3 serving as a barrier film is formed on the cover film 63.

When the multilevel interconnection structure shown in FIG. 2 is used, as is apparent from FIG. 2, the underlying interlevel film 4, the interlevel insulating films 33, 43, and 53, and the cover film 63 are deposited thick. For this reason, even if the nitride film 3 is formed on the surface of the semiconductor device, slow trapping is caused by the moisture contained in the underlying interlevel film 4 and the interlevel insulating films 33, 43, and 53. In order to prevent slow trapping, the nitride film 3 must be formed as closer to the surface of the silicon substrate 1 as possible.

FIG. 3 shows a conventional semiconductor device having a barrier film formed immediately after a transistor is formed. Referring to FIG. 3, gate polysilicon 9, a gate oxide film 9a, an LDD side wall oxide film 9b, and a field oxide film 10 are selectively formed on a silicon substrate 1. A nitride film 3 serving as a barrier film is formed on the silicon substrate 1 including the gate polysilicon 9 and the oxide films 9a, 9b, and 10. An underlying interlevel film 4 is formed on the nitride film 3. That is, no interlevel insulating film is present between the silicon substrate 1 and the nitride film 3. For this reason, no slow trapping is caused by the moisture contained in an interlevel insulating film.

In this structure, however, since the nitride film 3 is directly formed on the source/drain diffusion layer area of the silicon substrate 1, stress is produced in the nitride film 3 or energy levels and the like appear at the silicon interface, resulting in an increase in leakage current.

In order to solve these problems, the structure of the semiconductor device disclosed in Japanese Patent Laid-Open No. 2-158132 has been proposed. FIG. 4 shows the semiconductor device disclosed in this reference. An underlying oxide film 2 is formed on a silicon substrate 1 after a transistor is formed, and a nitride film 3 serving as a barrier film is formed on the underlying oxide film 2. By forming the underlying oxide film 2 between the silicon substrate 1 and the nitride film 3, the stress in the nitride film 3 can be reduced.

In the semiconductor device shown in FIG. 4, however, the following serious problem is posed. This problem will be described in detail with reference to FIGS. 5A to 5G showing the steps in manufacturing the semiconductor device in FIG. 4.

As shown in FIG. 5A, the underlying oxide film 2 having a thickness of 100 to 2,000 Å is formed on the silicon substrate 1 to reduce the stress in the barrier film. The nitride film 3 having a thickness of 50 to 500 Å is formed on the underlying oxide film 2 to prevent the entry of moisture. An underlying interlevel film 4 having a thickness of 8,000 to 15,000 Å is formed on the nitride film 3 to flatten the surface of the semiconductor device.

As shown in FIG. 5B, a contact hole 5 is formed through the underlying interlevel film 4, the nitride film 3, the underlying oxide film 2.

As shown in FIG. 5C, a protective film 6 is formed on a portion of the underlying interlevel film 4 which is located around the contact hole 5 and in the contact hole 5. This protective film 6 prevents the occurrence of a leakage current due to lattice defects on the surface of the silicon substrate 1 when a dopant is implanted into the silicon substrate 1 to obtain good ohmic contact. Note that an n-type dopant is implanted into the contact hole on an n-type diffusion area, and a p-type dopant is implanted into the contact hole on a p-type diffusion area.

The protective film 6 is formed to have a thickness of 100 to 300 Å by CVD (Chemical Vapor Deposition). However, since the coverage of a plasm CVD oxide film is not very good, the protective film 6 formed on the side wall of the contact hole 5 becomes thinner toward the bottom portion of the contact hole 5.

As shown in FIG. 5D, the protective film 6 on the underlying interlevel film 4 and the bottom surface of the contact hole 5 is removed by anisotropic etching. At this time, a spontaneous oxide film (not shown) is formed on the bottom surface of the contact hole 5, i.e., a portion of the silicon substrate 1 which is located in the contact hole 5.

As shown in FIG. 5E, oxide film wet etching is performed to remove the spontaneous oxide film in the contact hole 5. More specifically, etching is performed for about 30 seconds using a solution having a composition ratio of $HF:NH_4F=$ 1:30 with 5% $NHF_2$ as an etchant. As a result, the contact resistance can be decreased.

At this time, as shown in FIG. 5D, the protective film 6 is hardly formed on the bottom portion of the side wall of the contact hole 5, and the nitride film 3 is not etched by oxide film wet etching. For this reason, as shown in FIG. 5E, the underlying interlevel film 4 and the underlying oxide film 2 are etched to form an overhang 3a of the nitride film 3. Note that if etching is performed for 30 seconds, the overhang 3a has a protrusion amount of about 300 Å.

As shown in FIG. 5F, a barrier metal 7 is formed on a portion of the underlying interlevel film 4 which is located around the contact hole 5 and in the contact hole 5 by sputtering. This barrier metal 7 prevents a reaction between the silicon substrate 1 and an interconnection metal or the like formed in the contact hole 5 afterward.

Since the overhang 3a is formed in the contact hole 5, the barrier metal 7 is not sufficiently sputtered on a portion 3b under the overhang 3a. As a result, a portion of the silicon substrate 1 is exposed.

As shown in FIG. 5G, an interconnection metal 8 is formed on a portion of the barrier metal 7 which is located around the contact hole 5 and in the contact hole 5. At this time, the silicon substrate 1 is partly exposed at the portion 3b because of insufficient sputtering of the barrier metal 7, and the interconnection metal 8 is in direct contact with the silicon substrate 1. Therefore, the interconnection metal 8 and the silicon substrate 1 react with each other when annealing or the like is performed. If, for example, the material for the interconnection metal 8 is aluminum or an aluminum alloy, this metal reacts with the silicon substrate 1 to form alloy spikes, resulting in a leakage current.

Assume that a buried metal 8' is formed by using tungsten (W) generated by a vapor phase reaction of $WF_4$ gas instead of the interconnection metal 8 in FIG. 5G. In this case, fluorine (F) in the $WF_4$ gas reacts with the silicon substrate 1 to form a recess 3c in the portion below the overhang 3a formed on the bottom portion of the contact hole 5, resulting in a leakage current.

As semiconductor devices become smaller in size and higher in integration degree, the contact size becomes smaller, and the aspect ratio of each contact increases. It is therefore expected that the coverage on the bottom portion of a contact will deteriorate according to the conventional sputtering techniques. For this reason, sputtering with a larger vertical sputter component, such as long sputtering or collimate sputtering, will dominate the future sputtering techniques. In this case, if the overhang 3a is formed on the side wall of the contact hole 5, the influence of the shadow portion formed on the silicon substrate 1 owing to the overhang 3a becomes stronger.

SUMMARY OF THE INVENTION

It is an object of the present invention to provide a semiconductor device which prevents a leakage current from being produced due to an overhang formed on the side wall of a contact hole, and a method of manufacturing the same.

In order to achieve the above object, according to the present invention, there is provided a semiconductor device comprising a silicon substrate on which a semiconductor element is formed, a first insulating film formed on the silicon substrate, a barrier film formed on the first insulating film to prevent moisture from externally entering, a contact hole formed through the barrier film and the insulating film to a depth at which the silicon substrate is exposed, a protective film formed on a side surface of the contact hole to protect the first insulating film against etching which is performed to remove a spontaneous oxide film formed on a surface of the silicon substrate which is exposed on a bottom surface of the contact hole, a barrier metal continuously formed on at least the side and bottom surfaces of the contact hole and serving as a buffer conductor, and an interconnection metal buried in the contact hole on which the barrier metal is formed.

DESCRIPTION OF THE PREFERRED EMBODIMENT

The present invention will be described in detail below with reference to the accompanying drawings.

Figure 1A:
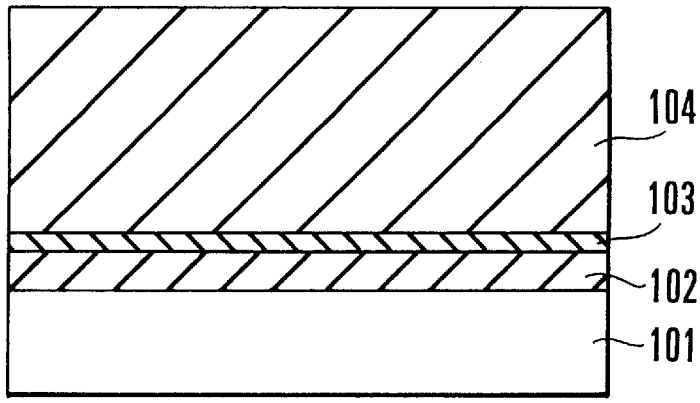
FIGS. 1A to 1G are sectional views showing the steps in manufacturing a semiconductor device according to an embodiment of the present invention.

FIGS. 1A to 1G show the steps in manufacturing a semiconductor device according to an embodiment of the present invention. As shown in FIG. 1A, an underlying oxide film 102 having a thickness of 100 to 15,000 Å and is formed on a silicon substrate 101, on which semiconductor elements are formed, to reduce the stress. A nitride film 103 having a thickness of 50 to 500 Å is formed, as a barrier film for preventing the entry of moisture, on the underlying oxide film 102. An underlying interlevel film 104 consisting of a BPSG (Borophosphosilicate Glass) film having a thickness of 5,000 to 15,000 Å is formed on the nitride film 103 to flatten the surface of the semiconductor device.

As described above, a multilayer structure constituted by the underlying oxide film 102 serving as an insulating film, the nitride film 103 serving as a barrier film, and the underlying interlevel film 104 serving as an insulating film is formed on the silicon substrate 101. If the underlying oxide film 102 is formed to have a predetermined thickness or more, the underlying interlevel film 104 need not be formed. In addition, nitrogen ions may be implanted into the underlying oxide film 102 to nitride the surface of the underlying oxide film 102 so as to form a barrier film instead of forming the nitride film 103.

Figure 1B:
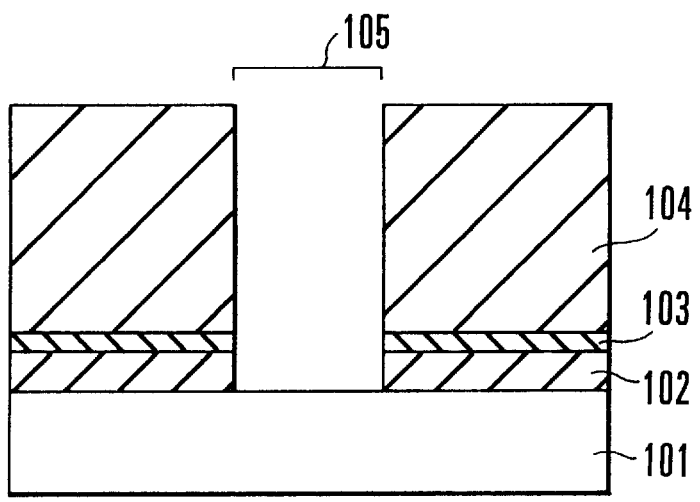
Figure 1C:
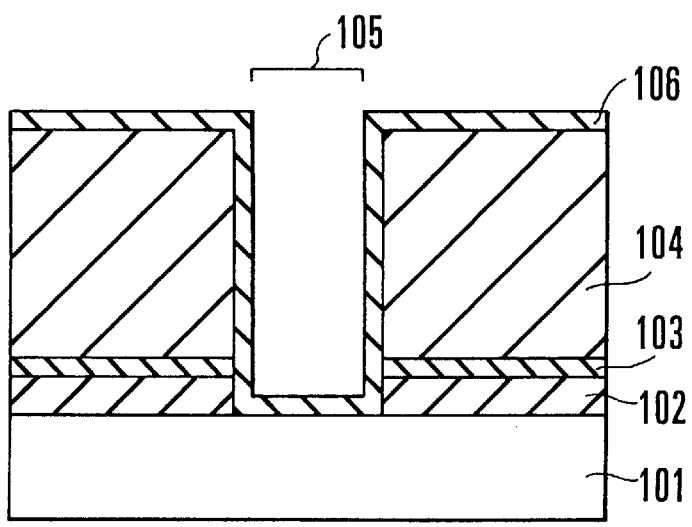

As shown in FIG. 1B, a contact hole 105 is formed through the underlying interlevel film 104, the nitride film 103, and the underlying oxide film 102. Thereafter, as shown in FIG. 1C, a protective film 106 consisting of an HTO (Hot Temperature Oxide) film is formed by thermally oxidizing a portion of the underlying interlevel film 104 which is located around the contact hole 105 and the inner surface of the contact hole 105. Since the protective film 106 is formed by thermal oxidation, it has a uniform thickness of 50 to 500 Å.

Subsequently, in order to obtain good ohmic contact, ions are implanted into a portion of the silicon substrate 101 which is located on the bottom portion of the contact hole 105. More specifically, an n-type high-concentration dopant is implanted into a portion of the contact hole 105 which is located on an n-type diffusion layer, and a p-type high-concentration dopant is implanted into a portion of the contact hole 105 which is located on a p-type diffusion layer.

Figure 1D:
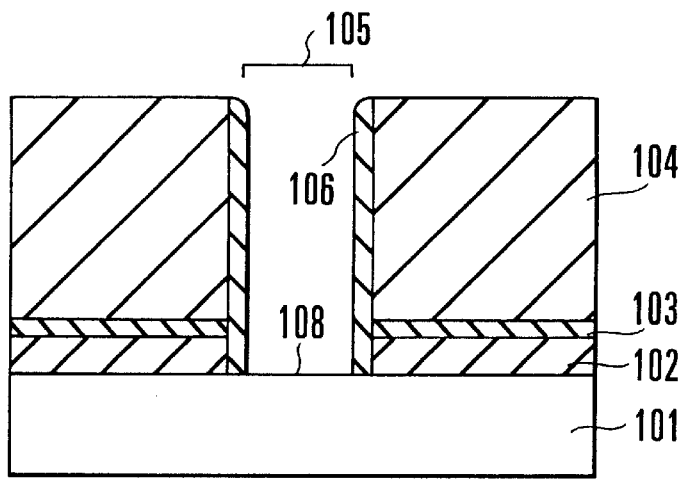
Figure 1E:
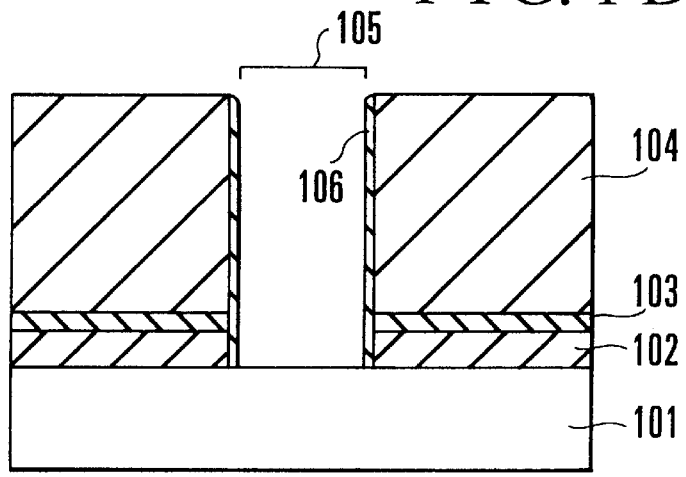

As shown in FIG. 1D, the protective film 106 is removed by anisotropic etching, except for the portion on the side wall of the contact hole 105. As a result, the silicon substrate 101 is exposed on the bottom portion of the contact hole 105, and a spontaneous oxide film 108 is formed on the exposed portion of the silicon substrate 101. As shown in FIG. 1E, oxide film wet etching is performed to decrease the contact resistance, and the spontaneous oxide film 108 on the silicon substrate 101 is removed. In this case, in order to prevent the side wall of the contact hole 105 from being etched, the etching time is adjusted such that the HTO protective film 106 is left on the side wall of the contact hole 105. If, for example, etching is performed for 20 seconds using 130 BHF, the HTO protective film 106 having a thickness of 50 to 100 Å can be left.

Figure 1F:
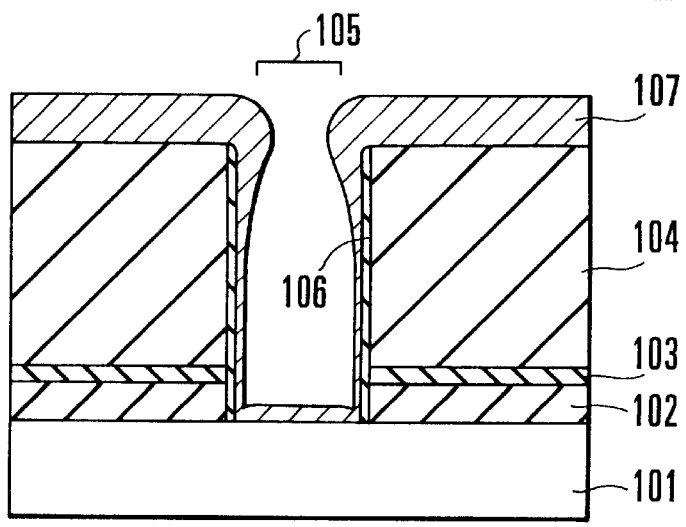

As shown in FIG. 1F, a barrier metal 107 serving as a buffer conductor is formed on a portion of the underlying interlevel film 104 which is located around the contact hole 105 and in the contact hole 105 by sputtering. In this case, since no overhang of the nitride film 103 is formed on the side wall of the contact hole 105, the barrier metal 107 having an almost uniform thickness can be formed on the bottom surface of the contact hole 105.

Note that barrier metal 107 is formed by forming a titanium (Ti) film, a titanium nitride film, or a titanium/titanium nitride composite film to have a thickness of 500 to 3,000 Å. For example, the barrier metal 107 is formed by forming a Ti film having a thickness of about 500 Å first, and then forming a TiN film having a thickness of 1,500 Å on the Ti film.

Figure 1G:
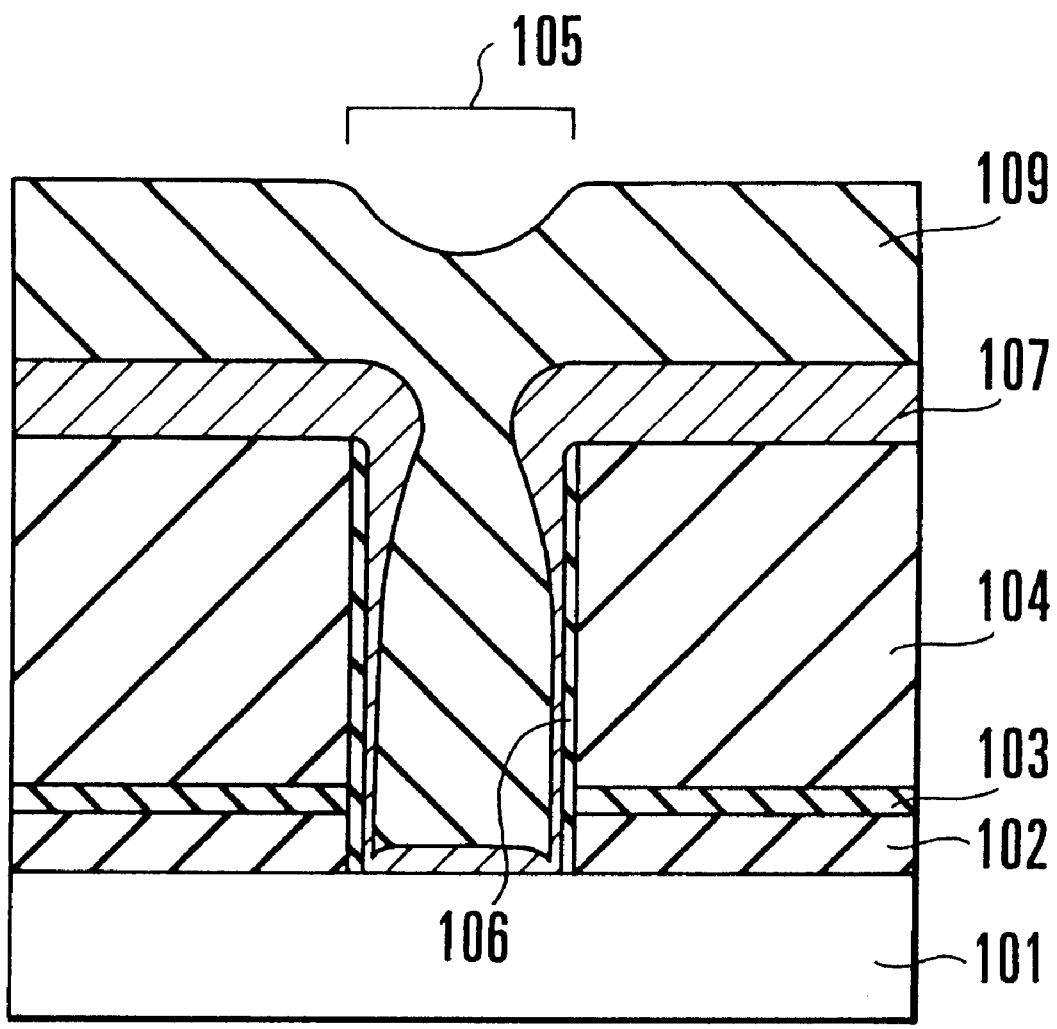
Figure 2:
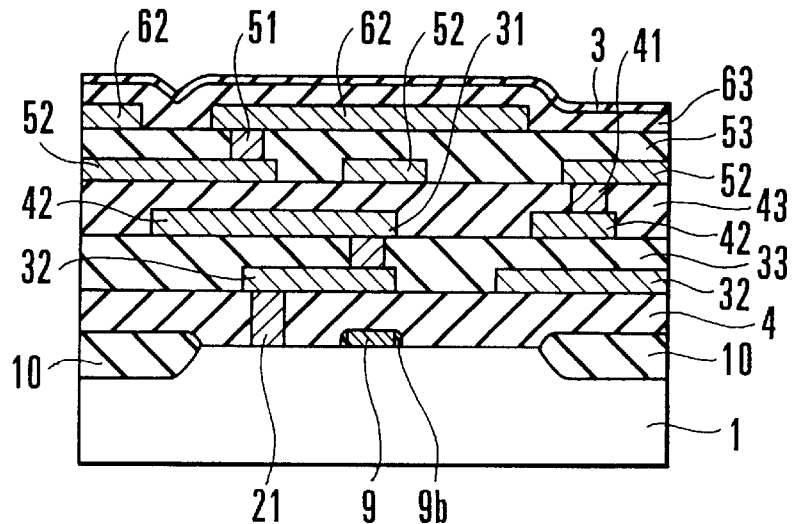
FIG. 2 is a sectional view showing a conventional semiconductor device.
Figure 3:
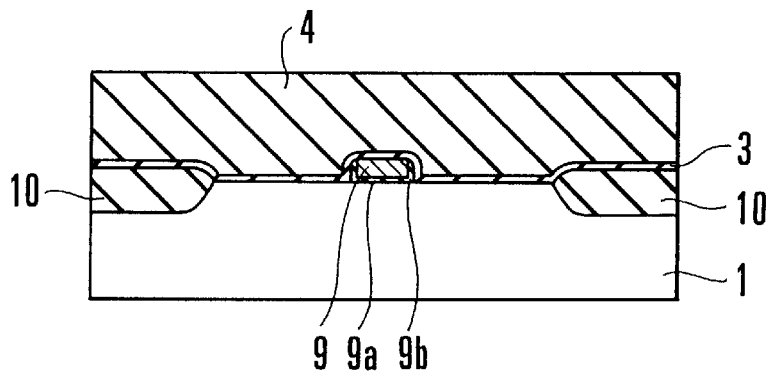
FIG. 3 is a sectional view showing another conventional semiconductor device.
Figure 4:
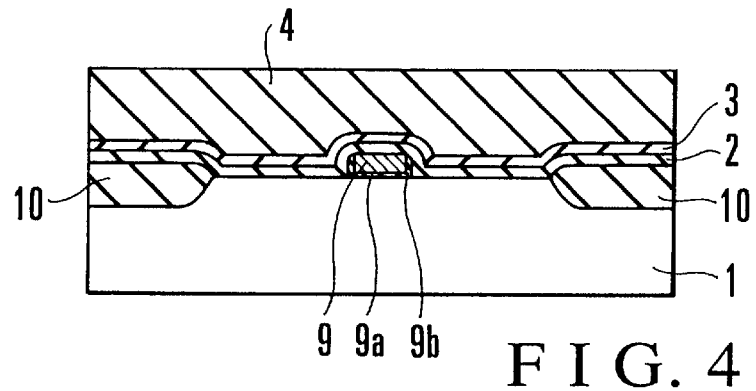
FIG. 4 is a sectional view showing still another conventional semiconductor device.
Figure 5A:
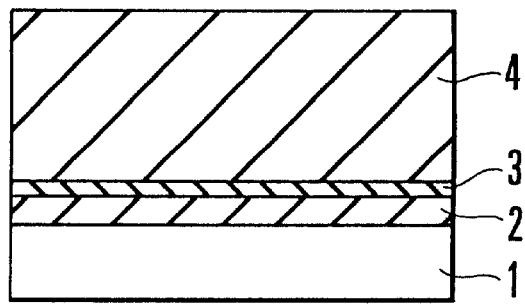
FIGS. 5A to 5G are sectional views showing the steps in manufacturing the conventional semiconductor device in FIG. 4.
Figure 5B:
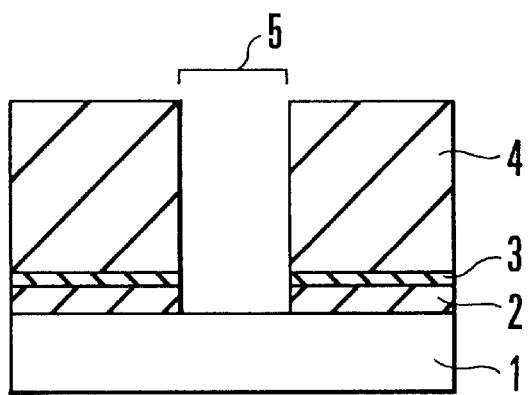
Figure 5C:
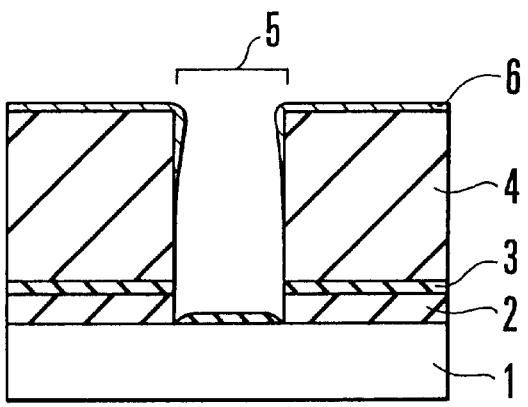
Figure 5D:
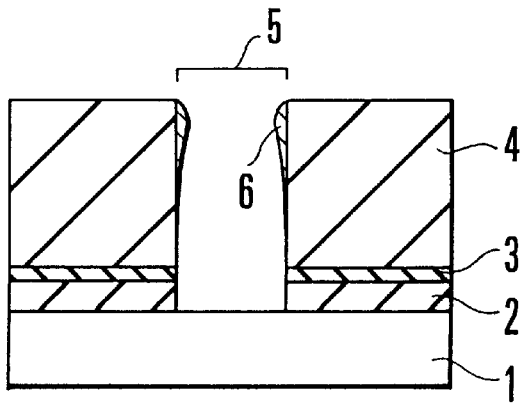
Figure 5E:
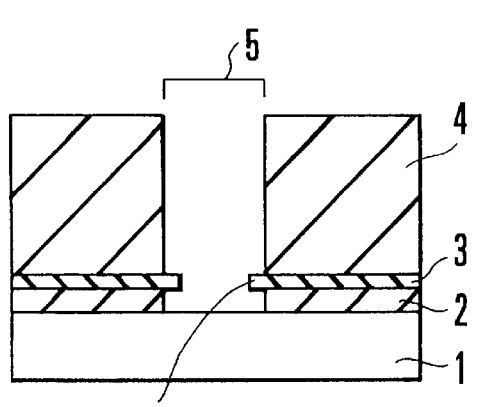
Figure 5F:
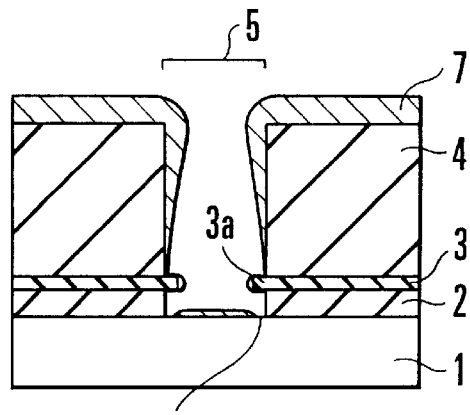
Figure 5G:
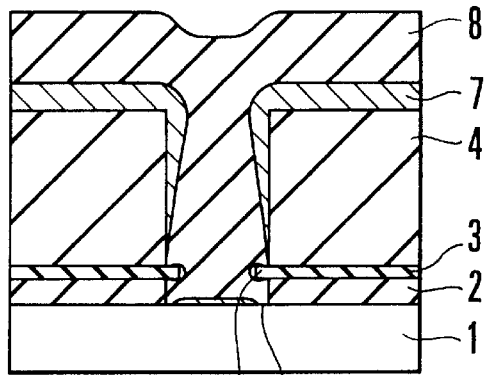
Figure 6:
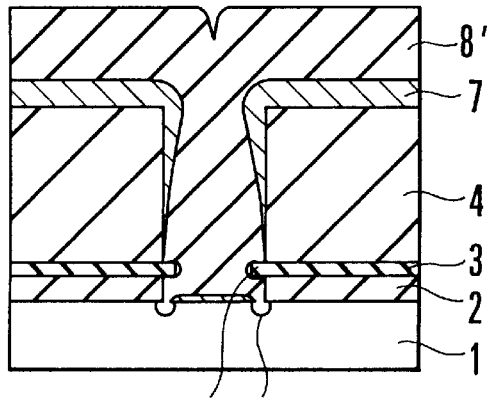
FIG. 6 is a sectional view showing another example of the step in FIG. 5G.

As shown in FIG. 1G, an interconnection metal 109 is formed on a portion of the barrier metal 107 which is located around the contact hole 105 and in the contact hole 105. In this case, the barrier metal 107 is continuously formed on the wall surface and bottom surface of the contact hole 105 and the portion of the underlying interlevel film 104 which is located around the contact hole 105. For this reason, even if the interconnection metal 109 is formed in the contact hole 105 after the barrier metal 107 is formed, the interconnection metal 109 does not come into direct contact with the silicon substrate 101, and no leakage current is produced.

For example, the following numerical values are set for the above semiconductor device. The thickness of the underlying oxide film 102 is about 1,500 Å; the thickness of the nitride film 103, about 200 Å; the thickness of the underlying interlevel film 104, about 1,000 Å; and the thickness of the HTO protective film 106, about 200 Å.

In the above embodiment, an HTO film is used as the protective film 106. However, a polysilicon or nitride film may be used. In this case, since either of these films is not etched by oxide film wet etching, an etching time can be arbitrarily set as long as it is equal to or longer than the time required to remove a spontaneous oxide film. For example, etching can be performed for 30 seconds by using 130 BHF.

As has been described above, according to the present invention, a protective film is formed on the side wall of a contact hole to prevent an overhang of a barrier film on the side wall of the contact hole when etching is performed in the contact hole. For this reason, a barrier metal can be uniformly sputtered onto the inner surface of the contact hole so as not to expose the silicon substrate. As a result, contact between the silicon substrate and the interconnection metal can be prevented, and hence the generation of a leakage current can be prevented.

What is claimed is:

1. A semiconductor device comprising:

a silicon substrate on which a semiconductor element is formed;

a first insulating film formed on said silicon substrate;

a barrier film formed on said first insulating film to prevent moisture from externally entering;

a contact hole formed through said barrier film and said insulating film to a depth at which said silicon substrate is exposed;

a protective film formed on a side surface of said contact hole to protect said first insulating film against etching which is performed to remove a spontaneous oxide film formed on a surface of said silicon substrate which is exposed on a bottom surface of said contact hole;

a barrier metal continuously formed on at least the side and bottom surfaces of said contact hole and serving as a buffer conductor; and an interconnection metal buried in said contact hole on which said barrier metal is formed wherein said barrier film has a thickness of 50 Å to 500 Å.

2. A device according to claim 1, further comprising a second insulating film formed on said barrier film, and wherein said contact hole is formed through said first and second insulating films and said barrier film to a depth at which said silicon substrate is exposed.

3. A device according to claim 2, wherein said barrier metal is further formed on a portion of said second insulating film which is located around said contact hole.

4. A device according to claim 1, wherein said barrier film essentially consists of a nitride film.

5. A device according to claim 1, wherein said barrier film is formed by implanting nitrogen ions into a surface of said first insulating film.

6. A device according to claim 1, wherein said protective film essentially consists of a film selected from the group consisting of an HTO oxide film, a polysilicon film, and a nitride film.

7. A semiconductor device comprising:

a silicon substrate on which a semiconductor element is formed;

a first insulating film formed on said silicon substrate;

a barrier film formed on said first insulating film to prevent entry of external moisture;

a contact hole formed through said barrier film and said insulating film to a depth at which said silicon substrate is exposed;

a protective film formed on a side surface of said contact hole to protect said first insulating film against etching which is performed to remove a spontaneous oxide film formed on a surface of said silicon substrate which is exposed on a bottom surface of said contact hole;

a barrier metal continuously formed on at least the side and bottom surfaces of said contact hole and serving as a buffer conductor; and an interconnection metal buried in said contact hole on which said barrier metal is formed, wherein said first insulating film has a thickness of 100 to 1,500 Å, said barrier film has a thickness of 50 to 500 Å; and said protective film has a thickness of 50 to 500 Å.

8. A semiconductor device comprising:

a silicon substrate on which a semiconductor element is formed;

a first insulating film formed on said silicon substrate;

a barrier film formed on said first insulating film to prevent moisture from externally entering;

a contact hole formed through said barrier film and said insulating film to a depth at which said silicon substrate is exposed;

a protective film formed on a side surface of said contact hole to protect said first insulating film against etching which is performed to remove a spontaneous oxide film formed on a surface of said silicon substrate which is exposed on a bottom surface of said contact hole;

a barrier metal continuously formed on at least the side and bottom surfaces of said contact hole and serving as a buffer conductor; and an interconnection metal buried in said contact hole on which said barrier metal is formed, said protective layer having a thickness of 50 to 500 Å.

9. A semiconductor device comprising:

a silicon substrate on which a semiconductor element is formed;

a first insulating film formed on said silicon substrate;

a barrier film formed on said first insulating film to prevent moisture from externally entering;

a contact hole formed through said barrier film and said insulating film to a depth at which said silicon substrate is exposed;

a protective film formed on a side surface of said contact hole to protect said first insulating film against etching which is performed to remove a spontaneous oxide film formed on a surface of said silicon substrate which is exposed on a bottom surface of said contact hole;

a barrier metal continuously formed on at least the side and bottom surfaces of said contact hole and serving as a buffer conductor; and an interconnection metal buried in said contact hole on which said barrier metal is formed, wherein said first film has a thickness of 100 to 1,500 Å, said barrier film has a thickness of 50 to 500 Å, and said protective film has a thickness of 50 to 500 Å.

* * * * *